United States Patent [19]

Ghezzo et al.

[11] 4,390,393
[45] Jun. 28, 1983

[54] METHOD OF FORMING AN ISOLATION TRENCH IN A SEMICONDUCTOR SUBSTRATE

[75] Inventors: Mario Ghezzo, Ballston Lake; Bruce F. Griffing, Schenectady, both of N.Y.

[73] Assignee: General Electric Company, Schenectady, N.Y.

[21] Appl. No.: 320,379

[22] Filed: Nov. 12, 1981

[51] Int. Cl.$^3$ .................................. H01L 21/308
[52] U.S. Cl. ........................... 156/643; 29/571; 29/580; 156/649; 156/653; 156/657; 357/50; 357/23; 427/93; 427/94; 427/399
[58] Field of Search ............ 156/643, 653, 657, 649; 427/93, 94, 399; 29/571, 580; 357/23 CS, 50

[56] References Cited

U.S. PATENT DOCUMENTS

| | | | |
|---|---|---|---|
| 3,886,000 | 5/1975 | Bratter et al. | 357/50 |
| 3,966,577 | 6/1976 | Hochberg | 156/643 |
| 4,042,726 | 8/1977 | Kaji | 156/653 |
| 4,063,992 | 12/1977 | Hosack | 156/653 |
| 4,104,086 | 8/1978 | Bondur et al. | 156/643 |
| 4,139,442 | 2/1979 | Bondur et al. | 156/643 |
| 4,140,558 | 2/1979 | Murphy et al. | 357/50 |
| 4,203,800 | 5/1980 | Kitcher et al. | 156/643 |
| 4,274,909 | 6/1981 | Venkataraman et al. | 29/571 |
| 4,317,273 | 3/1982 | Guterman et al. | 29/571 |
| 4,333,965 | 6/1982 | Chow et al. | 156/643 |

*Primary Examiner*—Jerome W. Massie
*Attorney, Agent, or Firm*—Julius J. Zaskalicky; James C. Davis, Jr.; Marvin Snyder

[57] ABSTRACT

A method of defining in a substrate of silicon an active region, a region of field oxide and an isolating wall of silicon dioxide therebetween in a single masking step. The substrate is covered in succession with a thin layer of silicon dioxide, a thick layer of silicon nitride and a first film of titanium. The first film of titanium is covered with a layer of photoresist which has a removed portion and a retained portion in registry with the active region. The first film of titanium and the layer of silicon nitride are etched through the removed portions of the layer of photoresist to form an opening extending to the thin layer of silicon dioxide and partially underlying the retained portion of the photoresist layer by a predetermined lateral distance. A second film of titanium is deposited on the retained portion of the photoresist layer and the exposed portion of the thin layer of silicon dioxide. The retained portion of the photoresist layer with the portion of the second film of titanium thereon is removed. Thus, an edge of the retained portion of said first film of titanium is laterally spaced from an adjacent edge of the retained portion of the second film of titanium deposited on the thin layer of silicon dioxide by approximately the aforementioned predetermined lateral distance. Using the first and second thin layers of titanium, a trench is etched into the substrate. The trench is thereafter filled with silicon dioxide.

6 Claims, 10 Drawing Figures

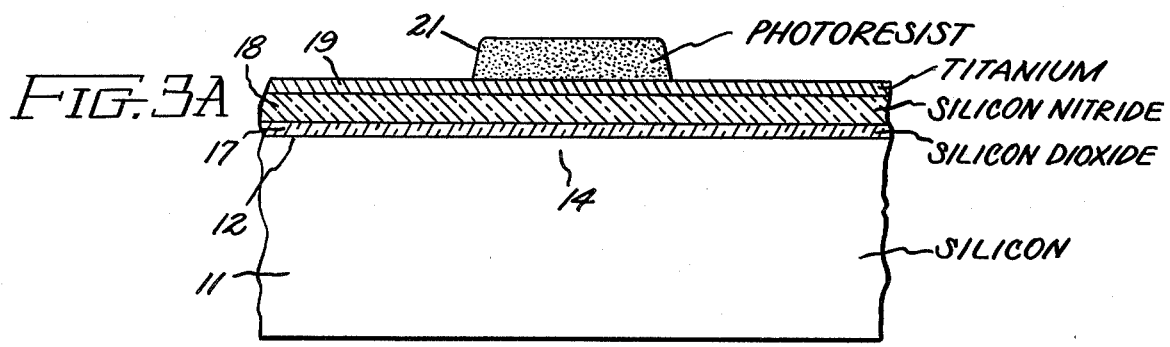
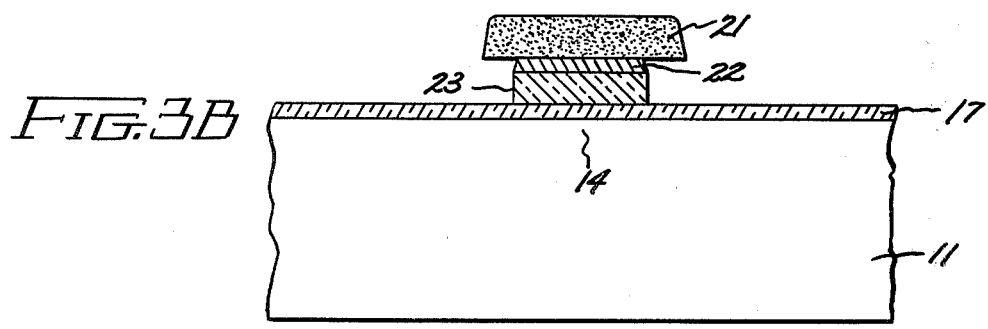
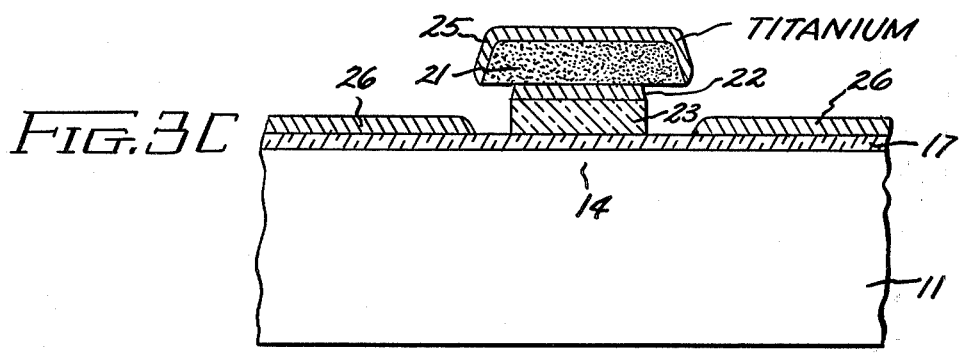
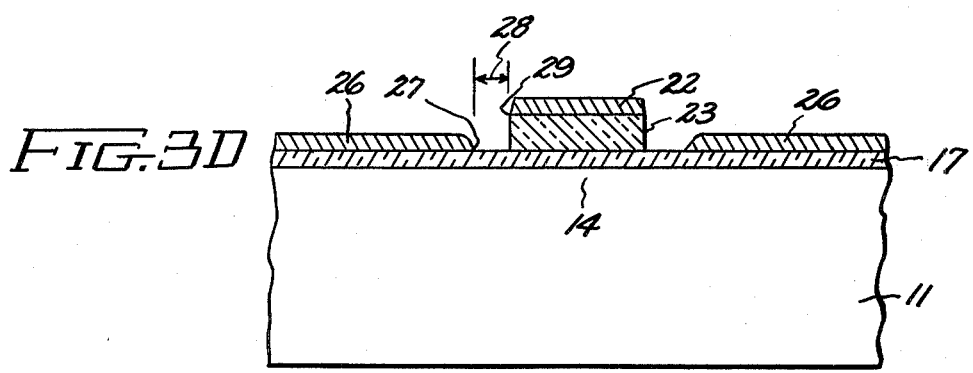

METHOD OF FORMING AN ISOLATION TRENCH IN A SEMICONDUCTOR SUBSTRATE

The present invention relates in general to integrated circuits and in particular to integrated circuits utilizing silicon dioxide regions to electrically isolate adjacent devices thereof.

As the dimensions of elementary devices in VLSI (very large scale integrated) circuits become smaller, it is important to minimize the distance between adjacent devices while maintaining electrical isolation between them. Oxide isolation is used to reduce the separation between adjacent devices which otherwise would be required to avoid undesired electrical coupling of adjacent devices. Such undesired electrical coupling occurs, for example, when P channel and N channel transistor devices in a CMOS (complementary-metal-oxide-semiconductor) integrated circuit are so closely spaced that they form parasitic bipolar transistor structures that can act electrically like a silicon controlled rectifier. "Latch up" or undesired conduction occurs through the adjacent devices in response to transients such as bursts of radiation.

The present invention is directed to provide a relatively simple and inexpensive method of fabricating integrated circuit devices with oxide isolation.

In carrying out the method of the present invention in accordance with one embodiment thereof a substrate of silicon semiconductor material having a major surface is provided. The substrate is covered in succession with a thin layer of silicon dioxide, a thick layer of silicon nitride and a first film of titanium. The first film of titanium is covered with a layer of photoresist which has a removed portion and a retained portion in registry with the active region. The first film of titanium and the layer of silicon nitride are etched through the removed portions of the layer of photoresist to form an opening in the first film of titanium and in the layer of silicon nitride extending to the thin layer of silicon dioxide. The opening partially surrounds the retained portion of photoresist layer and partially underlies the retained portion of the photoresist layer by a predetermined lateral distance. A second film of titanium is deposited on the retained portion of the photoresist layer and the exposed portion of the thin layer of silicon dioxide. The retained portion of the photoresist layer with the portion of the second film of titanium thereon is removed whereby an edge of the retained portion of the first film of titanium is laterally spaced from an adjacent edge of the retained portion of the second film of titanium deposited on the thin layer of silicon dioxide by approximately the aforementioned predetermined lateral distance. The substrate and the thin layer of silicon dioxide not covered with retained portions of the first and second films of titanium are then etched to form a trench in the substrate having one side extending from the edge of the retained portion of the first film and having the opposite side thereof extending from the adjacent edge of the retained portion of the second film, the depth of the trench being substantially greater than the width thereof. Thereafter the first and second films overlying the major surface of the substrate are removed.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIGS. 3A–3H show cross sections of structures illustrating successive steps in one method of fabricating the composite structure of FIGS. 1 and 2 in accordance with the present invention.

Figure 1:
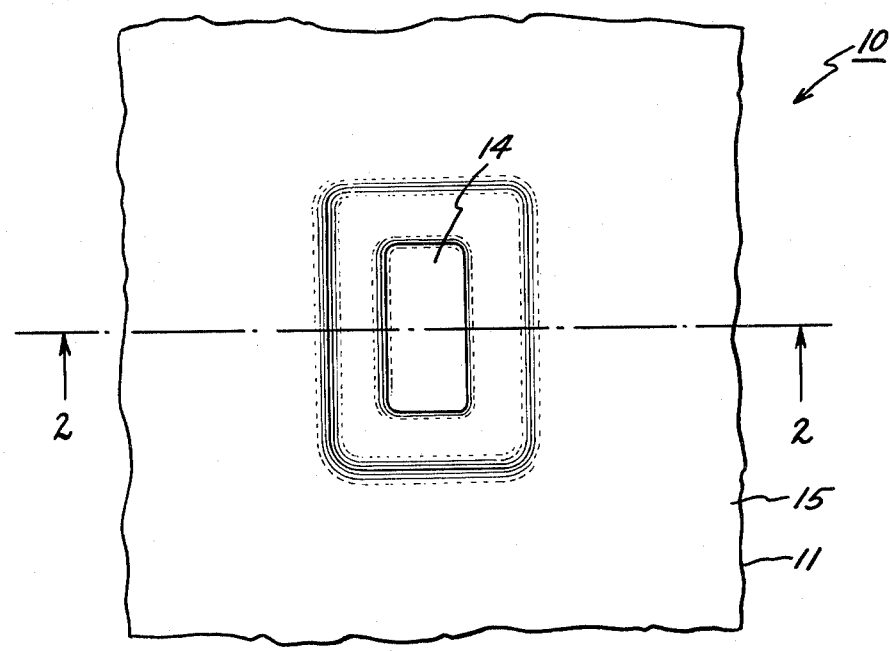
FIG. 1 is a plan view of a composite body representing a section of an integrated circuit showing a silicon substrate on which is formed a single active region surrounded by a wall of silicon dioxide.
Figure 2:
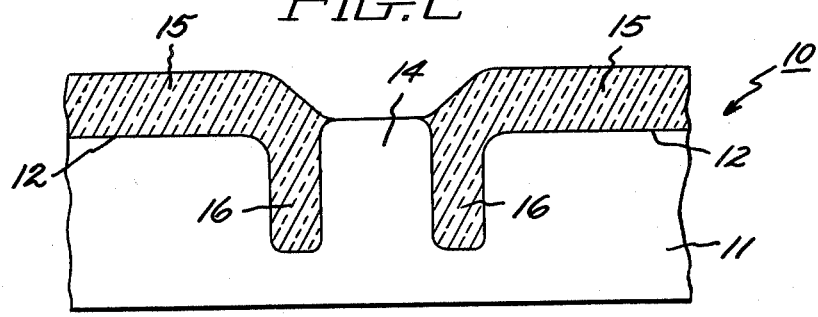
FIG. 2 is a cross-sectional view of the section of the substrate of FIG. 1 taken along section lines 2—2 thereof.

Referring now to FIGS. 1 and 2, there is shown a composite body 10 representing a part of an integrated circuit made in accordance with the present invention. The composite body includes a substrate 11 having a major surface 12 in which is provided an active region 14 surrounded by a thick layer 15 of silicon dioxide on the major surface 12 of that substrate and by a thick isolating wall 16 of silicon dioxide extending substantially orthogonal to the major surface 12 for a distance substantially greater than the width thereof into the substrate and joined to the thick isolating layer 15. Active components of devices, such as field effect transistors (not shown), may be formed in the active region and are isolated from other such active components formed on the substrate by the thick wall layer 16 and the thick surface layer 15 of silicon dioxide.

Figure 3E:
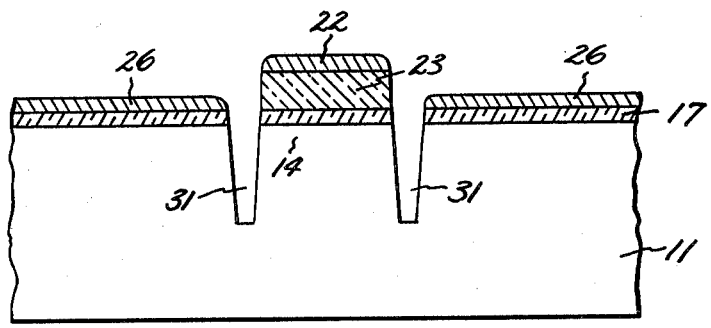
Figure 3F:
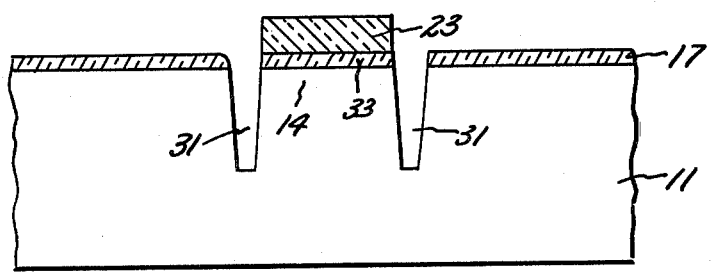
Figure 3G:
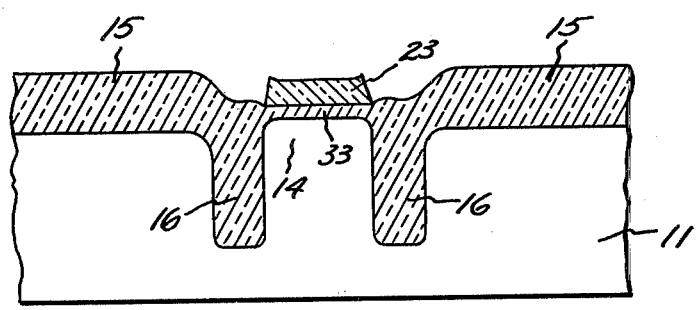
Figure 3H:
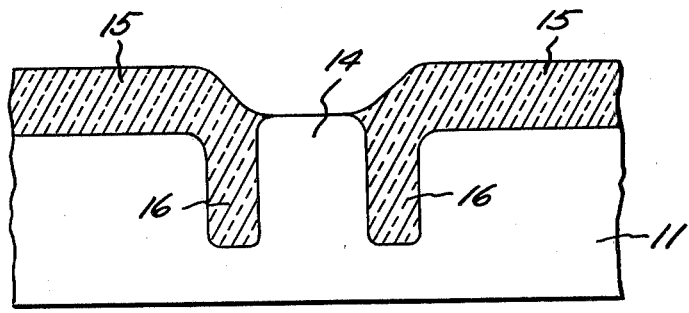

A method of fabricating the composite structure of FIGS. 1 and 2 in accordance with the present invention will now be described in connection with FIGS. 3A–3H. Elements of FIGS. 3A–3H identical to elements of FIGS. 1 and 2 are identically designated. A substrate 11 of silicon semiconductor material of 10 ohm-centimeter resistivity and N-type conductivity having a major surface 12 parallel to a (100) crystallographic plane thereof is provided. A first layer 17 of silicon dioxide about 400 Angstroms thick is formed on the major surface 12 by techniques well known in the art, as shown in FIG. 3A. For example, the silicon substrate is exposed to an ambient of oxygen at atmospheric pressure and at a temperature of about 1000° C. for a period of 40 minutes. A second layer 18 of silicon nitride is deposited on the surface of the first layer of silicon dioxide by chemical vapor deposition. In this process vapors of silane and ammonia in the ratio of 1:200 by volume are utilized at a temperature of 1000° C. in a hydrogen carrier and for a time period of 10 minutes to form a layer of silicon nitride about 1000 Angstroms thick. The first layer of silicon dioxide and the second layer of silicon nitride together constitute a protective layer. A third layer or film 19 of an ion erosion resistant material, such as titanium, about 2000 Angstroms thick is then sputtered over the second layer of silicon nitride. A fourth layer of a suitable resist such as azide resist AZ1470 available from the Shipley Company of Newton, Mass., one micron thick is provided over the third layer 19 of titanium. The fourth layer of resist is exposed and developed to provide a retained portion 21 thereof overlying the active region 14 of the substrate. The exposed portions of the layer 19 of titanium as well as the portion of the layer 18 of silicon nitride underlying the exposed portions of the layer of titanium are plasma etched to provide a retained portion 22 of the layer of titanium underlying the retained portion 21 of the layer of photoresist and to provide another retained portion 23 of silicon nitride underlying the retained portion 22 of titanium. The plasma etching operations are carried out for a time sufficient to produce an undercutting of the layer 19 of titanium underneath the retained portion 21 of the photoresist and also an undercutting of the layer of silicon nitride, as shown in FIG. 3B. The titanium layer is plasma etched in carbon tetrachloride to remove the titanium dioxide on the surface thereof and immediately thereafter is wet etched in a mixture of fluoroboric acid and water in a ratio of 1 part of fluoroboric acid to 10 parts of water by volume. The silicon nitride layer is plasma etched in carbon tetrafluoride with 4% oxygen. Next, a fifth layer or film of titanium about 2000 Angstroms thick is evaporated over the retained portion 21 of the photoresist and the exposed portions of the first layer 17 of silicon dioxide as shown in FIG. 3C. In the next step of the process the retained portion 21 of the layer of photoresist is removed in a suitable photoresist stripper such as acetone, which also removes the portion 25 of the fifth layer of titanium deposited thereon. The resultant structure is shown in FIG. 3D in which another portion 26 of the fifth layer of titanium is located on the layer 17 of silicon dioxide and retained portion 22 of the third layer of titanium is located on top of retained portion 23 of silicon nitride. Portion 26 of the fifth layer of titanium has an edge 27 spaced laterally a short distance 28 from an edge 29 of retained portion 22 of the third layer of titanium. The spacing between edges 27 and 29 is set by the amount of undercutting of the third layer of titanium in the process of etching this layer to form the retained portion 22 thereof. This lateral distance may be quite small, for example 0.5 of a micron. In the next step of the process, the surface of the substrate 11 and the layer of silicon dioxide unprotected by portions 22 and 26 of titanium are reactive ion etched to form a trench 31 extending through the layer 17 of silicon dioxide and into the substrate 11 to the desired depth, for example, 1.5 microns, as shown in FIG. 3E. For reactive ion etching of silicon dioxide $CHF_3$ is used and for reactive ion etching of silicon $CCl_4$ is used. Preferably the depth of the trench is large in relation to its width. The retained portion 22 of the third layer of titanium and the portion 26 of the fifth layer of titanium are then removed using buffered hydrofluoric acid to provide the structure shown in FIG. 3F. The substrate is then heated in an oxidizing atmosphere to cause the portions of the substrate exposed by the trench 31 and the portions of the substrate adjacent the major surface of the substrate to be converted to silicon dioxide as shown in FIG. 3G. Next, the retained portion 23 of silicon nitride overlying the active region of the substrate is removed utilizing a suitable etch such as hot phosphoric acid to provide a structure with a portion 33 of layer 17 of silicon dioxide overlying the active region. The retained portion 33 of silicon dioxide and the surface adjacent portion of the thick layer 15 of silicon dioxide are removed using a suitable etch such as buffered hydrofluoric acid to expose the surface of the surface adjacent region 14 and to remove irregularities and undulations in the surface of the thick layer 15 of silicon dioxide as shown in FIG. 3H. Active components or devices, such as field effect transistors, may be formed in the active region 14 and would be isolated from other active components formed in the substrate by the wall 16 of silicon dioxide.

Particular advantages of the structure are that the surface portion of the active region 14 retains its size and location on the major surface of the substrate as assigned prior to the processing of the substrate with minimum shrinkage thereof due to the processing of the substrate to form the dielectric isolating layer, while at the same time providing a wall or walls surrounding the active region and extending deep into the substrate without requiring the use of considerable surface area of the silicon substrate. The method according to the present invention also enables the thickness of the thick surface layer of silicon dioxide or field oxide to be independently set at a proper value with respect to parasitic capacitance and threshold levels for the conductors to be formed thereon.

While in the process described above, titanium is used as the ion erosion resistant material, other ion erosion resistant materials such as aluminum can be used.

While in the process described reactive ion etching in carbon tetrachloride was used to form the trench 31, other means such as plasma etching in carbon tetrachloride could be used.

While in the process described above an opening in the third layer of titanium and the second layer of silicon nitride was etched through the removed portion of the layer of photoresist to the first layer of silicon dioxide, the layer of silicon dioxide could have been etched, if desired. In this case a part of the fifth layer of titanium would be deposited on the silicon substrate.

While in the process described above a substrate of silicon semiconductor material was used, the substrate could have been constituted of other semiconductor materials such as compound semiconductors, for example, gallium arsenide, gallium aluminum arsenide, and gallium aluminum arsenide phosphide.

While in the process described above the trench in the silicon substrate was filled with thermally grown silicon dioxide, the trench could have been filled with silicon dioxide by chemical vapor deposition, for example, by pyrolytic decomposition of silane in an oxidizing atmosphere. Also, if desired, the trench could have been partially filled with silicon dioxide by heating the substrate in an oxidizing atmosphere to cause silicon dioxide to be grown on the exposed surfaces of the trench and then fully filled by chemical vapor deposition of silicon dioxide.

While in the process described above the trench in the silicon substrate was filled with silicon dioxide, it could have been filled with other insulating materials, for example silicon nitride, if desired.

While in the process described above a silicon substrate of n-type conductivity is utilized, of course, it is apparent that p-type conductivity substrates as well could be utilized.

While in the process described above with specific thicknesses for the first thin layer of silicon dioxide, for the second thick layer of silicon nitride, for the third layer of titanium, for the fourth layer of photoresist and for the fifth layer of titanium are utilized, it will be understood that a range of thicknesses may be utilized for these layers.

While in the process described above, a protective layer consisting of a retained portion of a thin layer of silicon dioxide and an overlying retained portion of silicon nitride was used, the protective layer may be constituted of other combinations of layers or a single layer, for example, a thick layer of silicon nitride grown on the silicon substrate. Such a layer would be provided by implanting nitrogen ions into the surface of the substrate in sufficient density by use of reactive ion beam apparatus and thereafter annealing the substrate to form the thick layer of silicon nitride.

While the invention has been described in a specific embodiment, it will be understood that modifications, such as those described above, may be made by those skilled in the art and it is intended by the appended claims to cover all such modifications and changes as fall within the true spirit and scope of the invention.

What is claimed is:

1. A method of forming in a substrate of silicon semiconductor material having a major surface an active region adjacent said major surface surrounded by a trench in said substrate filled with silicon dioxide, said trench being surrounded by a thick layer of silicon dioxide on said major surface independent of the dimensions of said trench comprising:

providing said substrate having said major surface, forming a thin layer of silicon dioxide on said major surface, forming a protective layer on said layer of silicon dioxide, forming a first film of an ion erosion-resistant material on said protective layer, forming on said first film a layer of an etch-resistant material having a removed portion and a retained portion, etching said first film and said protective layer through said removed portion of said etch-resistant layer to form an opening in said first film and said protective layer extending to and exposing said thin layer of silicon dioxide, said opening partially surrounding said retained portion of said etch-resistant layer and partially underlying said retained portion of said etch-resistant layer by a predetermined lateral distance, depositing a second film of an ion erosion-resistant material on the retained portion of said etch-resistant layer and the exposed portion of said thin layer of silicon dioxide, removing the retained portion of said etch-resistant layer with the portion of said second film thereon whereby an edge of the retained portion of said first film is laterally spaced from an adjacent edge of the retained portion of said second film deposited on said thin layer of silicon dioxide on said substrate by approximately said predetermined lateral distance, etching said substrate and said thin layer of silicon dioxide not covered with retained portions of said first and second films to form a trench in said substrate having one side extending from said edge of the retained portion of said first film and having the opposite side thereof extending from said adjacent edge of the retained portion of said second film, the depth of said trench being substantially greater than the width thereof, removing said first and second films overlying said major surface of said substrate whereby the exposed portions of said thin layer of silicon dioxide is re-exposed, heating said substrate in an oxidizing atmosphere to cause silicon dioxide to be grown on the walls of said trench to fill said trench with silicon dioxide and to cause silicon dioxide to be grown on the substrate underlying the exposed portion of said thin layer of silicon dioxide to form a thick layer of silicon dioxide thereon, removing the retained portion of said protective layer overlying said active region to expose said active region of said substrate.

2. The method of claim 1 in which said protective layer comprises a thick layer of silicon nitride.

3. The method of claim 1 in which said trench is formed by reactive ion etching said substrate not covered with retained portions of said first and second films.

4. The method of claim 1 in which said trench is formed by plasma etching said substrate not covered with retained portions of first and second films.

5. The method of claim 1 in which said ion erosion-resistant material is titanium.

6. The method of claim 1 in which said ion erosion-resistant material is aluminum.

* * * * *